(12) United States Patent
Oyama

(10) Patent No.: US 8,572,442 B2
(45) Date of Patent: Oct. 29, 2013

(54) DECODING ERROR DETECTION METHOD AND DECODING DEVICE IN RADIO COMMUNICATIONS SYSTEM

(75) Inventor: Teppei Oyama, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 687 days.

(21) Appl. No.: 12/730,217

(22) Filed: Mar. 23, 2010

(65) Prior Publication Data
US 2010/0251038 A1 Sep. 30, 2010

(30) Foreign Application Priority Data

Mar. 24, 2009 (JP) ................................ 2009-071071

(51) Int. Cl.
*G06F 11/00* (2006.01)
*H03M 13/00* (2006.01)
(52) U.S. Cl.
USPC .......................................... 714/708; 714/776
(58) Field of Classification Search
USPC .................. 714/708, 746, 712, 776, 819, 821
See application file for complete search history.

(56) References Cited

U.S. PATENT DOCUMENTS

| | | | | | |
|---|---|---|---|---|---|
| 5,995,562 | A | * | 11/1999 | Koizumi | 375/341 |
| 7,500,166 | B2 | * | 3/2009 | Miyazaki et al. | 714/748 |
| 2006/0140313 | A1 | | 6/2006 | Futami | |
| 2008/0043864 | A1 | | 2/2008 | Fujii | |

FOREIGN PATENT DOCUMENTS

| | | |
|---|---|---|
| JP | 2006-203843 A | 8/2006 |
| JP | 2006-262357 | 9/2006 |
| JP | 2008-48219 A | 2/2008 |

OTHER PUBLICATIONS

Wicker, S.B.; , "An adaptive type-I hybrid-ARQ technique using the Viterbi decoding algorithm," Military Communications Conference, 1988. MILCOM 88, Conference record. 21st Century Military Communications—What's Possible? 1988 IEEE , vol., No., pp. 307-311 vol. 1, Oct. 23-26, 1988.*

Yinshu Tang; Moonho Lee; , "Iterative chase-2 algorithm using threshold for block turbo codes decoding design," Microwave, Antenna, Propagation and EMC Technologies for Wireless Communications, 2005. MAPE 2005. IEEE International Symposium on , vol. 2, No., pp. 1154-1157 vol. 2, Aug. 8-12, 2005.*

Chase, D.; , "Class of algorithms for decoding block codes with channel measurement information," Information Theory, IEEE Transactions on , vol. 18, No. 1, pp. 170-182, Jan. 1972.*

Himsoon, T.; Siriwongpairat, W.P.; Weifeng Su; Liu, K.J.R.; , "Differential Modulations for Multinode Cooperative Communications," Signal Processing, IEEE Transactions on , vol. 56, No. 7, pp. 2941-2956, Jul. 2008.*

"Japanese Office Action" mailed by JPO and corresponding to Japanese application No. 2009-071071 on Jan. 8, 2013, with partial English translation.

* cited by examiner

*Primary Examiner* — Cynthia Britt
(74) *Attorney, Agent, or Firm* — Fujitsu Patent Center

(57) ABSTRACT

A decoding device includes a decoding unit that decodes control data to generate decode data, the control data indicating a state of a radio propagation channel; a reliability calculating unit that calculates a reliability indicator indicating a reliability of the decode data; and an outputting unit that outputs decode data whose reliability indicator is larger than a specified threshold; wherein the reliability calculating unit calculates the reliability indicator of decode data to be decoded, based on a similarity indicator indicating a similarity between the decode data to be decoded and previous decode data whose reliability indicator is larger than the threshold.

14 Claims, 16 Drawing Sheets

FIG. 8

| REPORTING INTERVAL | Kadj |
|---|---|
| 10ms | 1.0 |
| 20ms | 0.8 |
| ... | ... |
| 80 ms OR MORE | 0.0 |

FIG. 10

| ΔP | Kadj |
|---|---|
| 0~10 | 1.0 |
| 10~20 | 0.8 |
| ... | ... |
| 100 OR MORE | 0.0 |

FIG. 11

| FREQUENCY | Kadj |
|---|---|
| 0~50 | 1.0 |
| 50~100 | 0.8 |
| ... | ... |
| 200 OR HIGHER | 0.0 |

FIG. 12

| CHANGE IN TOTAL RECEPTION POWER | Kadj |
|---|---|
| 5 dB OR LESS | 1.0 |
| 5dB~10dB | 0.8 |
| ... | ... |
| 20 dB OR MORE | 0.0 |

FIG. 13

| CONTINUOUS ERROR COUNT | Kadj |
|---|---|
| 0 | 1.0 |
| 1 | 0.8 |
| ... | ... |
| 10 OR MORE | 0.0 |

FIG. 14

| FADING FREQUENCY | DIFFERENCE IN TOTAL RECEPTION POWER FROM PREVIOUS ONE | CQI REPORTING INTERVAL | CONTINUOUS ERROR COUNT | Kadj |
|---|---|---|---|---|
| 0~50Hz | 5 dB OR LESS | 10ms | 0 | 1.0 |
| 50Hz~100Hz | 5 dB OR LESS | 10ms | 0 | 0.8 |
| ... | ... | ... | ... | ... |
| 50Hz~100Hz | 5dB~10dB | 40ms | 2 | 0.1 |
| ... | ... | ... | ... | ... |

FIG. 16

| PMI WHEN DECODING SUCCEEDED | PMI RECEIVED THIS TIME | INTER-PMI DISTANCE |
|---|---|---|
| 0 | 0 | 0 |
| 1 | 0 | 0.3 |
| ... | ... | ... |
| 3 | 3 | 0 |

DECODING ERROR DETECTION METHOD AND DECODING DEVICE IN RADIO COMMUNICATIONS SYSTEM

CROSS-REFERENCE TO RELATED APPLICATIONS

This application is based upon and claims the benefit of priority of the prior Japanese Patent Application No. 2009-71071, filed on Mar. 24, 2009, the entire contents of which are incorporated herein by reference.

FIELD

The present invention relates to radio communications and, for example, to a technology that is applicable to a wideband code division multiple access (W-CDMA) system.

BACKGROUND

A base transceiver station for radio communications exchanges control data with a mobile station to communicate therewith, and uses the control data to control the communication. When the control data is transmitted/received in an encoded state, the base transceiver station decodes the control data transmitted from the mobile station.

FIG. 1 is diagram illustrating one example of processing for decoding control data. FIG. 1 illustrates an example in which control data transmitted from a mobile station is a channel quality indicator (CQI) value indicative of a data reception quality of the mobile station and a base transceiver station decodes the CQI value by using a correlation detection method. Upon receiving the encoded CQI value from the mobile station, the base transceiver station performs correlation calculation for comparing received data with sequences (candidate sequences) that serve as candidates for an encoded sequence indicating information having a possibility of being transmitted as the CQI value. Thereafter, the base transceiver station performs decoding using a result of the correlation calculation and determines a reliability of the decoding result. When the determined reliability exceeds a certain threshold, the base transceiver station determines that the decoding was correctly performed.

The control data is used to control communication. Thus, when the control data is erroneously decoded, the communication efficiency may decline. Accordingly, it is desirable that correctly decoded data be used as the control data. Performing control using successfully decoded control data is desirable not only in the exemplary case illustrated in FIG. 1 but also in any communication in which encoded control data is transmitted/received.

One known decoding method using a correlation detection method is a method involving a process of determining a decoding reliability of a decoding result by using one or multiple correlation values obtained during correlation calculation and a process of correcting the decoding result based on the decoding reliability (refer to Japanese Laid-Open Patent Publication No. 2006-203843). As a related technology, for example, a communication device having a bitwise likelihood calculating unit for calculating a likelihood for each bit contained in an estimated transmission symbol and a receiver having a decoder for decoding a transmitted bit sequence by using a bitwise likelihood are known (e.g., refer to Japanese Laid-Open Patent Publication No. 2008-48219).

When controlled data that is not successfully decoded is used, the communication efficiency may decline. It is, therefore, desired that detection of a decoding error with respect to control data be performed with high accuracy.

SUMMARY

According to an aspect of the invention, a decoding device includes a decoding unit that decodes control data to generate decode data, the control data indicating a state of a radio propagation channel, and a reliability calculating unit that calculates a reliability indicator indicating a reliability of the decode data. The decoding device includes an outputting unit that outputs decode data whose reliability indicator is larger than a specified threshold, wherein the reliability calculating unit calculates the reliability indicator of decode data to be decoded, based on a similarity indicator indicating a similarity between the decode data to be decoded and previous decode data whose reliability indicator is larger than the threshold.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 8 illustrates one example of a table in which the values of weighting factors and intervals at which the CQI values are reported from the mobile station to the base transceiver station are associated with each other;

FIG. 10 illustrates one example of a table in which the relationships between the amounts of change in the delay profile and the weighting factors are set;

FIG. 11 illustrates one example of a table indicating relationships between the amounts of change in a fading frequency and the weighting factors;

FIG. 12 illustrates one example of a table indicating relationships between the amounts of change in reception power and the weighting factors;

FIG. 13 illustrates one example of a table indicating relationships between continuous error counts and the weighting factors;

FIG. 14 illustrates one example of a table in which information obtained by a weighting-factor calculating unit and the weighting factors are associated with each other;

FIG. 16 illustrates one example of a table indicating relationships between changes in a PMI number and inter-PMI distances.

DESCRIPTION OF EMBODIMENTS

<First Embodiment<

A case in which data transmitted as control data is a CQI (channel quality indicator) value indicating a reception quality at a mobile station is described by way of example. As described below, however, control data transmitted is not limited to a CQI value. Although a case in which a CQI value subjected to Reed-Muller encoding is decoded by a correlation detection method is described below by way of example, methods for encoding and decoding the control data are not limited to the examples described below.

Figure 1:
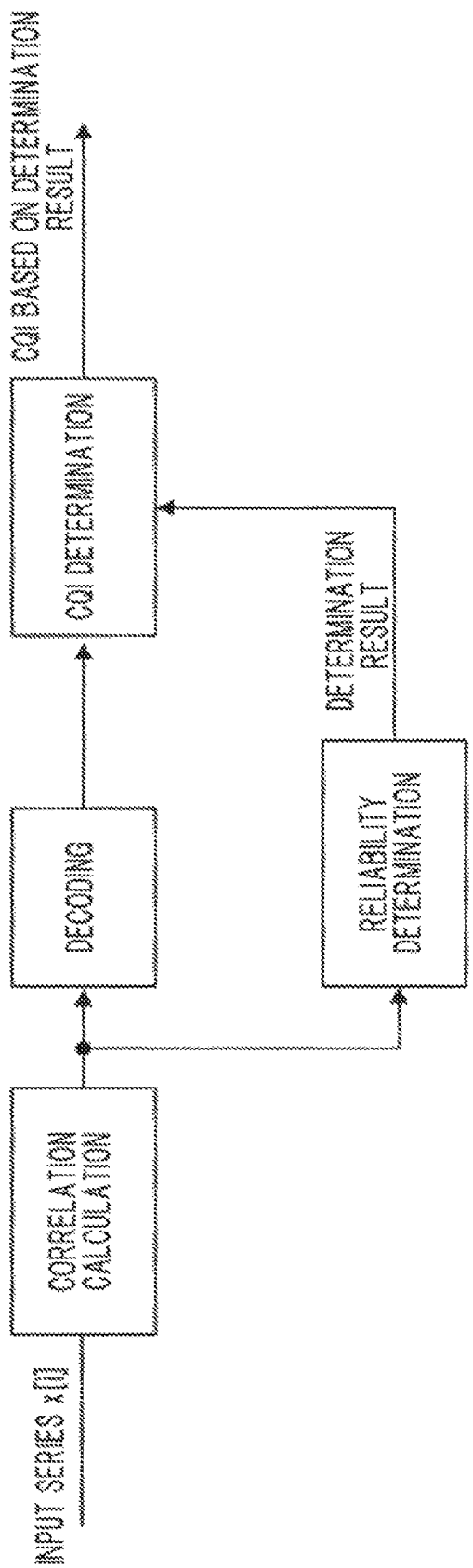
FIG. 1 is diagram illustrating one example of processing for decoding control data.
Figure 2:
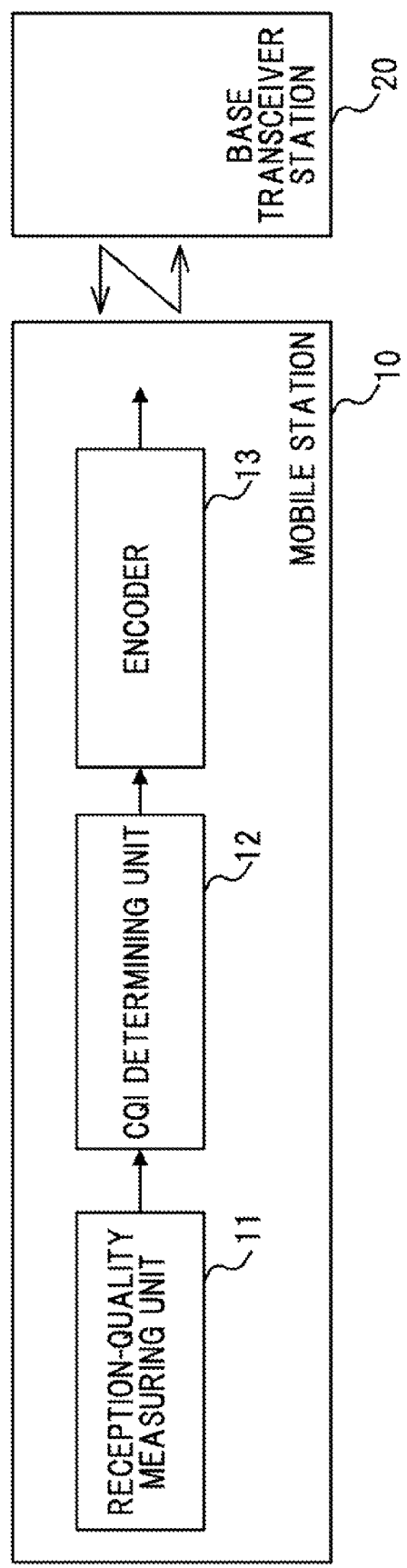
FIG. 2 is a diagram illustrating one example of the operation of a mobile station when encoded data is transmitted from the mobile station to a base transceiver station.

FIG. 2 is a diagram illustrating one example of the operation of a mobile station 10 when the encoded data is transmitted from the mobile station 10 to a base transceiver station 20. The mobile station 10 includes a reception-quality measuring unit 11, a CQI determining unit 12, and an encoder 13.

The reception-quality measuring unit 11 measures a reception quality of a signal that the mobile station 10 receives from the base transceiver station 20. While a description is given below of a case in which the reception-quality measuring unit 11 measures a reception signal-to-interference ratio (SIR) as the reception quality, the reception-quality measuring unit 11 may also measure another reception quality, such as reception power. Upon measuring the reception SIR of the mobile station 10, the reception-quality measuring unit 11 reports the value of the reception SIR to the CQI determining unit 12.

The CQI determining unit 12 converts the reception SIR into a CQI value, which is pre-specified so as to correspond to the reception SIR. For example, the CQI determining unit 12 may convert the reception SIR into a numeric value of 0 to 31, for example, into a numeric value of 0 when the reception SIR is less than 1 dB and into a numeric value of 1 when the reception SIR is 1 dB to less than 2 dB. The CQI determining unit 12 reports the determined CQI value to the encoder 13.

The encoder 13 encodes the CQI value. For example, for Reed-Muller encoding, the encoder 13 generates control data having 20-bit code by expressing the CQI value in a binary form and applying a specified Reed-Muller code to the CQI value. The control data encoded by the encoder 13 is transmitted from the mobile station 10 to the base transceiver station 20.

Figure 3:
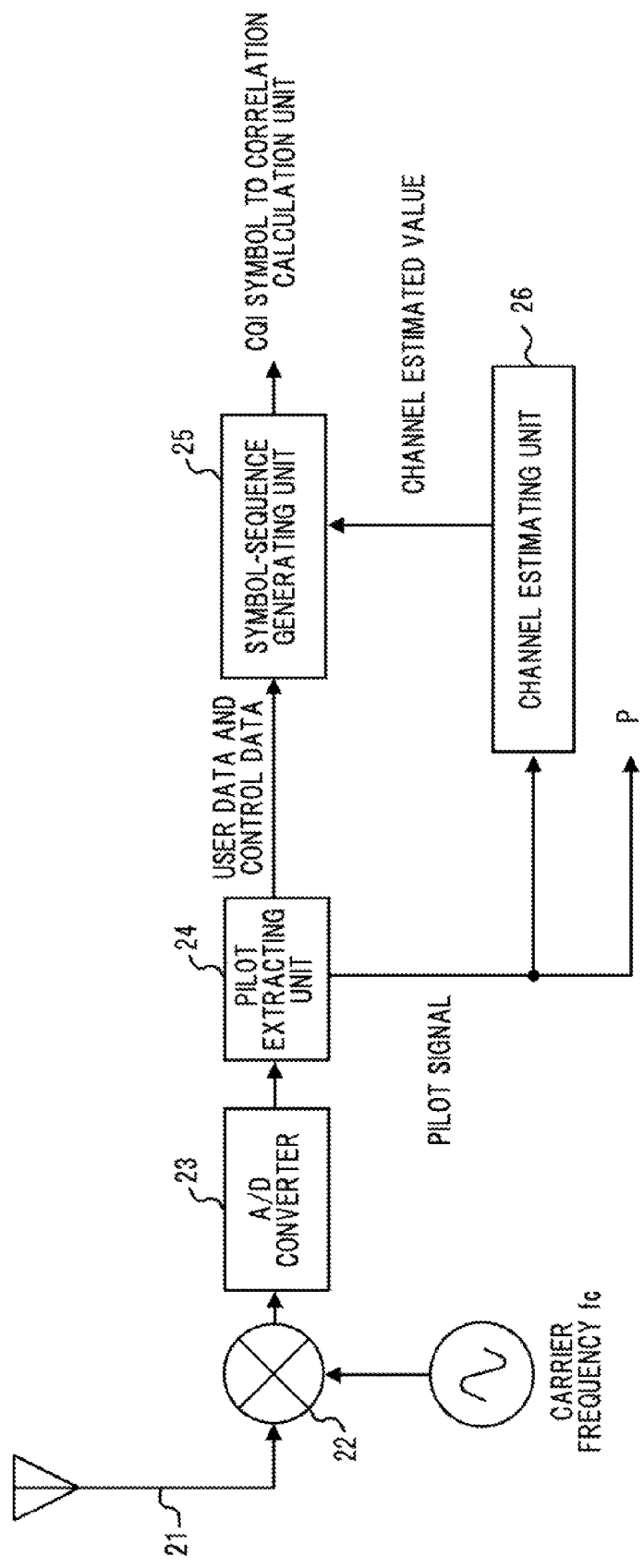
FIG. 3 is one example of a demodulation unit in the base transceiver station.

FIG. 3 is a diagram illustrating one example of a demodulation unit in the base transceiver station 20. The demodulation unit includes an antenna 21, a mixer 22, an A/D (analog-to-digital) converter 23, a pilot extracting unit 24, a symbol-sequence generating unit 25, and a channel estimating unit 26.

When the base transceiver station 20 receives a signal from the mobile station 10 via the antenna 21, the mixer 22 multiplies the received signal by a carrier frequency to convert the received signal into a baseband signal. The A/D converter 23 converts the baseband signal into a digital signal and outputs the digital signal to the pilot extracting unit 24.

The pilot extracting unit 24 extracts a pilot signal from the input digital signal and outputs the pilot signal to the channel estimating unit 26 and so on. The channel estimating unit 26 uses the input pilot signal to estimate a channel used for the communication and outputs a result of the estimation to the symbol-sequence generating unit 25. Other processing for the pilot signal is described below in detail. The pilot extracting unit 24 also outputs user data, control data, and so on other than the pilot signal to the symbol-sequence generating unit 25, so that a corresponding symbol sequence is generated. Of the generated symbol sequence, a symbol sequence for the encoded CQI value is subjected to processing performed by a decoding device, which is described below.

Figure 4:
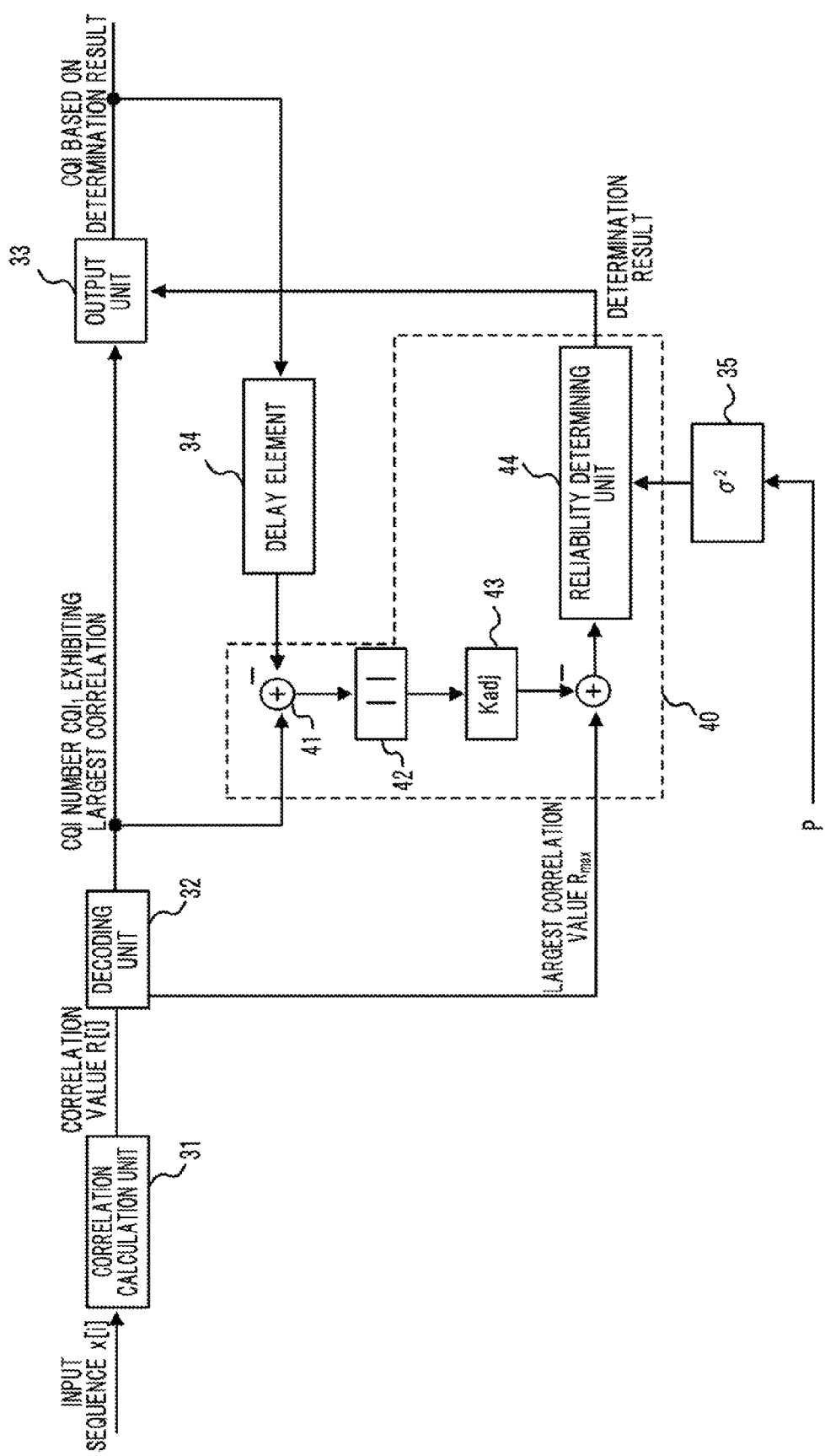
FIG. 4 illustrates one example of a decoding device according to a first embodiment.

FIG. 4 is a diagram illustrating one example of a decoding device according to the first embodiment. The decoding device illustrated in FIG. 4 includes a correlation calculation unit 31, a decoding unit 32, an output unit 33, a delay element 34, a noise determining unit 35, and a reliability calculating unit 40. The decoding device illustrated in FIG. 4 is merely one example and may be modified depending on a decoding method and implementation.

In the decoding device illustrated in FIG. 4, the correlation calculation unit 31 and the decoding unit 32 decode the data input from the symbol-sequence generating unit 25. When a symbol sequence (an input sequence) corresponding to encoded control data is input to the correlation calculation unit 31, the correlation calculation unit 31 compares the control data received from the mobile station 10 with sequences (candidate sequences) indicating information having a possibility of being transmitted as the control data. That is, the correlation calculation unit 31 compares the input symbol sequence with the Reed-Muller-encoded candidate sequence indicating a numeric value of 0 to 31 that may be taken as the CQI value. The correlation calculation unit 31 compares each candidate sequence with the input sequence one by one to determine a correlation value. The correlation value may be expressed by, for example, the number of bits indicating the same number for both the input sequence and the candidate sequence. When the correlation calculation unit 31 compares all candidate sequences with the input sequence to determine correlation values of the candidate sequences, the correlation calculation unit 31 associates the candidate sequences and the correlation values with each other and outputs the associated candidate sequence and correlation values to the decoding unit 32.

The decoding unit 32 compares the correlation values sent from the correlation calculation unit 31, and selects, as a decoding result, a candidate sequence exhibiting the largest correlation value relative to the input sequence. The decoding unit 32 decodes the Reed-Muller code (20 bits) of the selected decoding result into 5-bit data and outputs the 5-bit data to the output unit 33. For example, when the correlation value between the Reed-Muller-encoded candidate sequence indicating "15" and the input sequence is the largest, the decoding unit 32 selects, as a decoding result, the Reed-Muller-encoded candidate sequence indicating "15". Next, the decoding unit 32 converts the candidate sequence of the decoding result into 5-bit data indicating "15" and outputs the 5-bit data to the output unit 33. The decoding unit 32 also outputs the largest correlation value $R_{max}$ to the reliability calculating unit 40 so that the decoding unit 32 may determine a reliability (reliability indicator) of the decoding result.

The output unit 33 holds the CQI value input from the decoding unit 32 and waits until a determination result indicating whether or not the decoding processing is successful is reported from the reliability calculating unit 40. When the determination result indicating that decoding is successful is reported from the reliability calculating unit 40, the output unit 33 outputs the CQI value obtained by the decoding unit 32. The delay element 34 stores the CQI value, output from the output unit 33, as a CQI value for a case in which the decoding is successful. On the other hand, when a determination result indicating that the decoding is unsuccessful is reported from the reliability calculating unit 40, the output unit 33 discards the held CQI value without outputting the CQI value.

By using the pilot signal input from the pilot extracting unit 24, the noise determining unit 35 determines the amplitude of noise generated when the decoded control data is transmitted. The noise determining unit 35 reports a result of the determination to the reliability calculating unit 40.

The reliability calculating unit 40 includes an adder 41, an absolute-value determining unit 42, a weighting-factor multiplying unit 43, and a reliability determining unit 44. A description will be given of a case in which the reliability calculating unit 40 calculates a reliability indicator and the reliability determining unit 44 determines whether or not the reliability indicator exceeds a threshold and determines that the decoding is successful when the reliability indicator exceeds the threshold. The arrangement may also be such that the decoding device further includes a determining unit, the reliability calculating unit 40 outputs a reliability indicator to the determining unit, and the determining unit determines whether or not the decoding is successful by using the reliability indicator.

By using a difference between decode data to be decoded and decode data previously determined to be successfully decoded, the reliability calculating unit 40 determines a reliability indicator of the decode data to be decoded. Reliability-indicator calculation performed by the reliability calculating unit 40 will be described in conjunction with an example in which after successfully decoding one CQI symbol sequence, the base transceiver station 20 decodes another CQI symbol sequence. In the following description, a decoding result of a successfully decoded CQI symbol sequence will be referred to as "previous decode data $CQI_{prev}$," in order to distinguish among a plurality of CQI symbol sequences. Further, with respect to a CQI symbol to be decoded next to the successfully decoded CQI symbol, a CQI value obtained from the decoding unit 32 by using a candidate sequence exhibiting the largest correlation value will be referred to as decode data $CQI_{dec}$ to be decoded.

(1) When decode data to be decoded is input from the decoding unit 32, the reliability calculating unit 40 issues a request for the value of the previous decode data to the delay element 34. The adder 41 determines a difference between the decode data to be decoded and the previous decode data and outputs a result of the determination to the absolute-value determining unit 42.

(2) The absolute-value determining unit 42 determines an absolute value of the determination result of the adder 41. As a result of processes (1) and (2), the difference between the previous decode data and the decode data to be decoded and to be subjected to the reliability-indicator determination is determined. The absolute-value determining unit 42 outputs a result of the determination to the weighting-factor multiplying unit 43.

(3) The weighting-factor multiplying unit 43 multiplies the value, input from the absolute-value determining unit 42, by a preset weighting factor $K_{adj}$. The value determined by processes (1) to (3) is given by:

$$K_{adj} \times |CQI_{dec} - CQI_{prev}|$$

The weighting factor $K_{adj}$ is a numeric value indicating the size of contribution that the difference between first decode data and second decode data makes to the reliability indicator of the second decode data, and takes a value of zero or greater ($K_{adj} \geq 0$).

(4) When the reliability indicator of the second decode data is expressed by $R_{max}/\sigma2$ (where $R_{max}$ denotes the largest correlation value, and $\sigma2$ denotes a noise level when the second decode data is decoded), the reliability determining unit 44 corrects the reliability indicator ($R_{max}/\sigma2$) by using the value obtained in process (3). Thus, the reliability determining unit 44 calculates the reliability indicator C of the second decode data, as given by:

$$C = \frac{R_{max}}{\sigma^2} - K_{adj}|CQI_{dec} - CQI_{prev}| \tag{1}$$

The reliability determining unit 44 compares the reliability indicator with a threshold Th for determining whether or not the decoding is successful. Since the reliability indicator C represents the reliability of the decode data to be decoded, as described above, a large reliability indicator indicates that the reliability of the decode data to be decoded is high. The reliability determining unit 44 stores, as the threshold Th, the degree of reliability desired for the control data that the base transceiver station 20 uses to perform control. When the reliability indicator exceeds the threshold Th, the reliability determining unit 44 determines that data having a degree of reliability that may be used for control is decoded. For example, when the reliability indicator C takes a value that is greater than the threshold Th, the reliability determining unit 44 determines that the decoding is successful. Herein, when the reliability indicator takes a value that is greater than the threshold Th, this may be referred to as "success of decoding".

When the reliability indicator is greater than the threshold Th, the reliability determining unit 44 reports the success of the decoding to the output unit 33. The output unit 33 outputs the held decode data to be decoded. The data output from the output unit 33 is handled as correctly decoded control data and is used for control to be performed by the base transceiver station 20.

On the other hand, when the reliability indicator is smaller than or equal to the threshold Th, the reliability determining unit 44 determines that the reliability of the decode data to be decoded is not high enough to be usable as control data. The reliability determining unit 44 reports a determination result indicating the failure of the decoding to the output unit 33 so that the base transceiver station 20 does not use the decode data whose reliability indicator C is smaller than or equal to the threshold Th. Upon receiving the determination result indicating the failure of the decoding, the output unit 33 discards the held decode data to be decoded.

When a change in the state of the radio propagation channel is small, a change in the reception SIR value at the mobile station 10 is small. The CQI value indicates the reception SIR at the mobile station 10. When interference power is the same, it may be said that the smaller the difference between two CQI values is, the smaller the change in the reception SIR at the mobile station 10 is. Thus, when the change in the state of the radio propagation channel from when the previous CQI value is transmitted until a next CQI value is transmitted is small, it is highly likely that the CQI value transmitted next is the same as or close to the previous CQI value. Thus, when the CQI value changes greatly in a case in which a change in the radio propagation channel is small, for example, in a case in which both the mobile station 10 and the base transceiver station 20 are stationary, it is highly likely that the decoding is erroneous.

Figure 5:
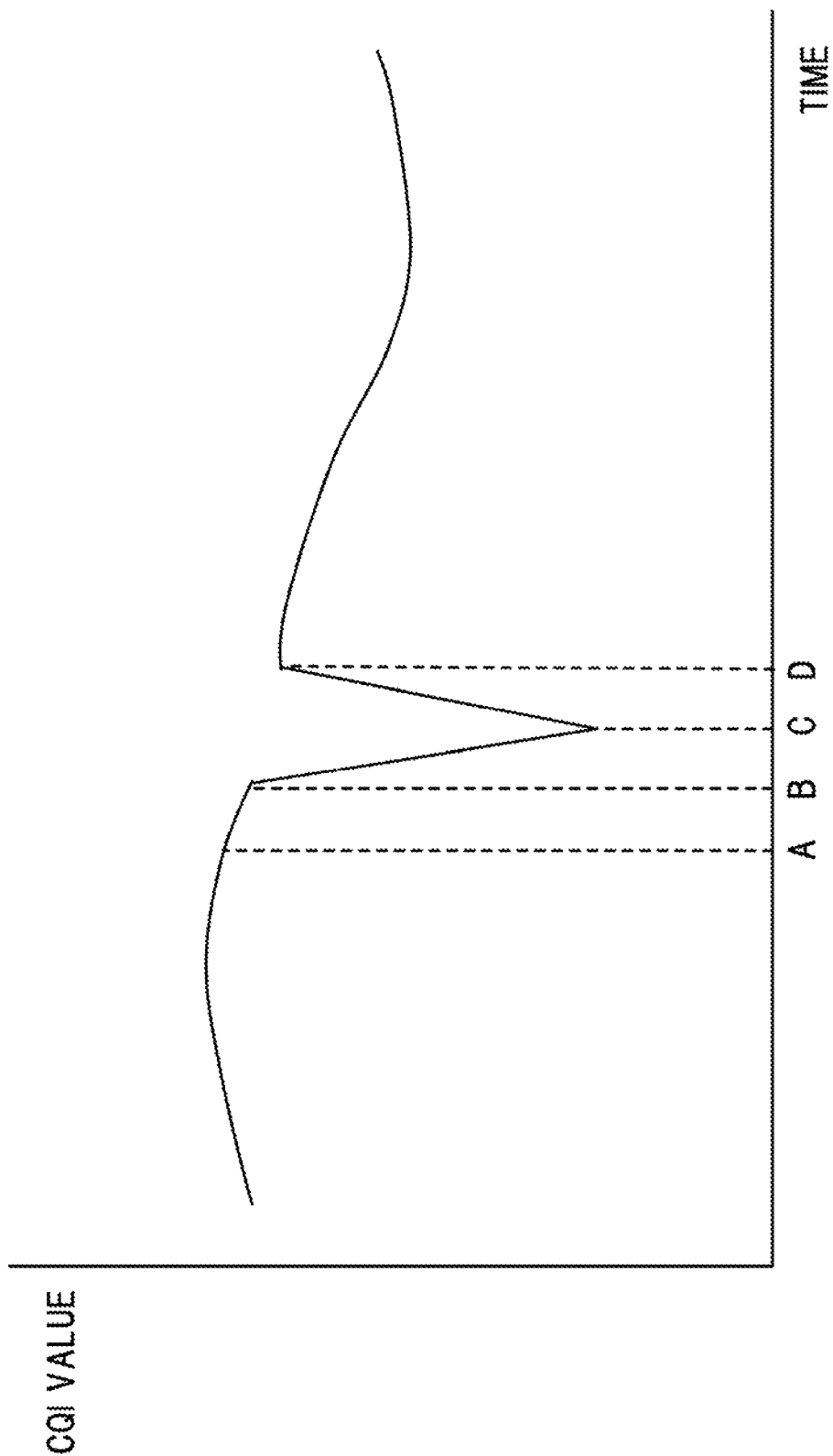
FIG. 5 illustrates one example of a change over time in a CQI value decoded by the base transceiver station.

FIG. 5 is a graph depicting one example of a change over time in the CQI value decoded by the base transceiver station 20. An example of the determination performed by the reliability calculating unit 40 will now be described with reference to FIG. 5. The solid line in FIG. 5 represents a change in the CQI value, and it is assumed that the mobile station 10 reports the CQI values to the base transceiver station 20 at times A, B, C, and D. It is assumed in this case that decoding of the CQI value transmitted at time A is successful and a CQI value of 18 ($CQI_A$) is obtained. It is also assumed that the weighting factor is 0.9, the value of $R_{max}/\sigma 2$ is 10 at any of times A to D, and the threshold Th is 5.

When the CQI value indicated by the decode data at time B is assumed to be 17 ($CQI_B$), a reliability indicator $C_B$ of decoding at time B is determined as:

$$C_B = \frac{R_{max}}{\sigma^2} - K_{adj}|CQI_B - CQI_A| = 10 - 0.9 \times |(17-18)| = 9.1$$

Comparison between the reliability indicator $C_B$ and the threshold Th indicates 9.1>5, that is, $C_B$>Th. Thus, the reliability of the decode data at time B is determined to have a degree of reliability that may be used for control. Thus, the reliability determining unit 44 reports success of the decoding to the output unit 33. The output unit 33 outputs the $CQI_B$, and the base transceiver station 20 uses the $CQI_B$ to perform communication control. The $CQI_B$ (=17) is also stored in the delay element 34.

When the CQI value obtained by decoding at time C is 7 ($CQI_C$), a reliability indicator $C_C$ of the decoding at time C is determined by:

$$C_C = \frac{R_{max}}{\sigma^2} - K_{adj}|CQI_C - CQI_B| = 10 - 0.9 \times |(7-17)| = 1$$

Comparison between the reliability indicator $C_C$ and the threshold Th indicates 1<5, that is, $C_C$<Th. When the state of the radio propagation channel does not change greatly, the CQI value does not basically change greatly. However, the CQI value at time C exhibits a sharp decrease. Consequently, a difference between the $CQI_B$ and the $CQI_C$ increases, so that the reliability $C_C$ of the decode data at time C falls below the intended reliability. That is, in this case, the decoded control data (CQI value) is highly likely to be erroneous. Accordingly, in order to prevent control using the decode data at time C from being performed, the reliability calculating unit 40 reports, to the output unit 33, a determination result indicating failure of the decoding at time C. Upon receiving the determination result, the output unit 33 discards the $CQI_C$, obtained at time C, without outputting the $CQI_C$. That is, the data stored in the delay element 34 is not updated and the $CQI_B$ remains.

Thereafter, when the CQI value obtained at time D is assumed to be 16 ($CQI_D$), a reliability indicator $C_D$ of decoding at time D is determined by:

$$C_D = \frac{R_{max}}{\sigma^2} - K_{adj}|CQI_D - CQI_B| = 10 - 0.9 \times |(16-17)| = 9.1$$

Comparison between the reliability indicator $C_D$ and the threshold Th indicates 9.1>5, that is, $C_D$>Th. Thus, the decode data at time D has a degree of reliability that may be used by the base transceiver station 20. Accordingly, the reliability determining unit 44 determines that the decoding is successful. Upon receiving the determination result, the output unit 33 outputs the $CQI_D$. Thus, the base transceiver station 20 uses the $CQI_D$ to perform control.

By contrast, when the reliability of decode data is to be determined using only the ratio of the correlation value to the noise level, decode data obtained when the CQI value changes greatly, like the CQI value at time C, is in some cases used for control. In such cases, the base transceiver station 20 sequentially performs control based on four CQI values $CQI_A$ to $CQI_D$. Consequently, when the decoding at time C is erroneous, a communication from when control based on the erroneously decoded $CQI_C$ is performed until control based on the correctly decoded $CQI_D$ is performed deteriorates.

However, as described above with reference to FIG. 5, the decoding device according to the present embodiment may detect a decoding error based on an abnormal change in the CQI value, even in a case in which the correlation value is sufficiently large relative to the noise level. Thus, as described above, the base transceiver station 20 uses, as the CQI values, the highly reliable $CQI_A$, $CQI_B$, and $CQI_D$ to perform communication control and so on, and does not perform control based on the $CQI_C$ having a reliability reduced by the change in the CQI value. That is, it is possible to prevent a decrease in the communication efficiency, the decrease being caused by the base transceiver station 20 performing control based on an erroneous decoding result. The difference between the first decode data and the second decode data may herein be referred to as a "similarity" or "similarity indicator" between the first decode data and the second decode data.

The capability to determine whether or not control data indicating the state of a radio propagation channel is successfully decoded by using the reliability indicator calculated from equation (1) noted above may also be explained as follows.

The correlation detection method based on maximum likelihood estimation is a decoding method utilizing the correlation value itself being representative of likelihood. Thus, when a transmission symbol sequence is represented by X[m] and a reception soft decision symbol is represented by r[m] (0≤m<Sequence Length), the probability that a soft decision symbol sequence becomes r[m] is given by:

P(r|X).

The probability that the transmission symbol is X[m] when the reception symbol is r[m] is given by:

P(X|r).

During decoding, with respect to all transmission symbol patterns X1[m] to Xn[m], P(X|r) is calculated and a symbol pattern having the highest probability is selected.

$P(r|X)*P(X)=P(r, X)=P(X|r)P(r)$

From this, it follows that:

$P(X|r)=P(r|X)P(X)/P(r)$.

With respect to all symbols, P(r|X)P(X) is compared. Suppose an additive noise environment where the distribution is σ2, it follows that:

$$P(r|X) = \frac{1}{\sqrt{2\pi\sigma^2}} \exp \frac{-\sum_m (r[m] - X[m])^2}{2\sigma^2}$$

$$= \frac{1}{\sqrt{2\pi\sigma^2}} \exp \frac{-\sum_m (r^2[m] - 2r[m]X[m] + X^2[m])}{2\sigma^2}$$

A logarithm thereof is given by:

$$\log P(r \mid X) \propto -\sum_m (r^2[m] - 2r[m]X[m] + X^2[m])$$

The correlation value is given by:

$$R = \sum_m (r[m]X[m])$$

Therefore, $$\log P(r \mid X) \propto 2R - \sum_m (r^2[m] + X^2[m])$$

Thus, for P(r|X)P(X), a logarithm is taken and a quantity as given by the following expression is estimated.

$$2R - \sum_m (r^2[m] + X^2[m]) + K \log P(X)$$

where K is an appropriate coefficient.

When comparison with respect to all transmission symbols are performed assuming that the amplitudes of all symbol sequences are the same for simplicity, values given by the following expression are the same for all the transmission symbol patterns.

$$\sum_m (r^2[m] + X^2[m])$$

Thus, with respect to all possible transmission symbols, calculation is performed based on:

$$2R + K \log P(X) \qquad 2$$

For general data, the probability P(X) that the symbol sequence X transmitted is the same for all patterns. In the case of the CQIs, however, the numeric values thereof indicate the reception quality of the mobile station 10, as described above. Thus, in the case of the CQIs, when a change in the propagation channel is small, the probability that a symbol having a numeric value that is the same as or close to a previous symbol is transmitted is high. Thus, the CQIs do not exhibit a uniform distribution, unlike general data. Accordingly, the second term in expression (2) is represented using a difference between successfully decoded previous decode data and decode data to be decoded and to be subjected to determination as to whether or not the decoding is successful. That is, the probability of transmission symbols is taken into account by using representation given by:

ti $K \log P(X) = K_{adj} |CQI_{dec} - CQI_{prev}|$

As described above, the decoding device illustrated in FIG. 4 provides sufficiently high correlation values relative to the noise level, and also may determine a reliability of the decoding of the second decode data, based on the amount of change from the first decode data to the second decode data. Thus, the use of the decode-data reliability determined with equation (1) to detect a decoding error makes it possible to improve the decoding-error detection accuracy, compared to a case in which the value of $R_{max}/\sigma 2$ is used to detect a decoding error. A decoding method in which a condition for determining that the decoding is successful is that the value of $R_{max}/\sigma 2$ exceeds a certain value has been used in cases in which advanced error detection using redundant bits for error detection may not be used for data transmission, for example, in a case in which decoding is performed using a correlation detection method. Thus, the use of the decoding device according to the present embodiment and the decoding-error detection method used for the decoding device makes it possible to improve the accuracy of detecting a decoding error in the control data even when redundant bits for error detection may not be used.

In a system in which a condition for determining that the decoding is successful is that the value of $R_{max}/\sigma 2$ exceeds a certain value, it is also conceivable that power that the mobile station 10 uses to transmit the CQI values is increased in order to improve the decoding quality. However, when the power that one mobile station uses to transmit the CQI values is increased, there are problems in that, for example, power consumed by the mobile station increases and also power interfering with another mobile station increases. In contrast, the use of the decoding-error detection method according to the present embodiment may improve the decoding-error detection accuracy at the base transceiver station 20. Thus, even without an increase in the power that the mobile station 10 uses to transmit the CQI values, the possibility that control data that is not successfully decoded is used is reduced. Thus, the use of the above-described decoding device may eliminate the need for the mobile station 10 to increase the power for transmitting the CQI values in order to prevent decoding errors. Consequently, it is also possible to avoid problems such as an increase in the power consumed by the mobile station 10 and an increase in the power interfering with another mobile station 10.

As a result of the use of the decoding device described above and the decoding-error detection method used for the decoding device, the decoding quality is improved. Consequently, the communication efficiency of the base transceiver station 20 may also be improved. In a mobile communications system, in order to enhance the communication efficiency of an entire cell, the base transceiver station 20 adaptively changes the transmission power and the modulation system of the mobile station 10 so as to correspond to the state of the propagation channel. For changing the modulation system or the like, the base transceiver station 20 uses a reception quality (indicated by CQI values or the like) of the mobile station 10. Thus, when the modulation system or the like is changed using an erroneously decoded CQI value, the base transceiver station 20 may not be able to optimize cell communications. Hence, the decoding-error detection accuracy improvement realized by the present embodiment is also advantageous for improving the communication efficiency.

<Second Embodiment>

A description in the first embodiment has been given of a case in which the weighting factor is pre-fixed to a certain value. However, for example, the state of the propagation channel may change due to movement of the mobile station 10 or the like. When decode data is discarded because of continuous failures of decoding or when the interval of transmission of the control data from the mobile station 10 to the base transceiver station 20 is large, the amount of time from when data corresponding to the previous decode data is received until data corresponding to the decode data to be decoded is received is increased. In such a case, there is a possibility that the state of the propagation channel changes from when data corresponding to the previous decode data is received until data corresponding to the decode data to be decoded is received. When the state of the propagation channel changes, the contents of the control data transmitted also vary. Thus, with the weighting factor being set to a large value, even when the decoding is successful, the reliability indicator of the decode data may become small because of a large difference between the successfully decoded previous decode data and the decode data to be decoded. A description in a second embodiment will be given of a decoding device that is capable of changing the weighting factor based on the probability of change in the control data.

Figure 6:
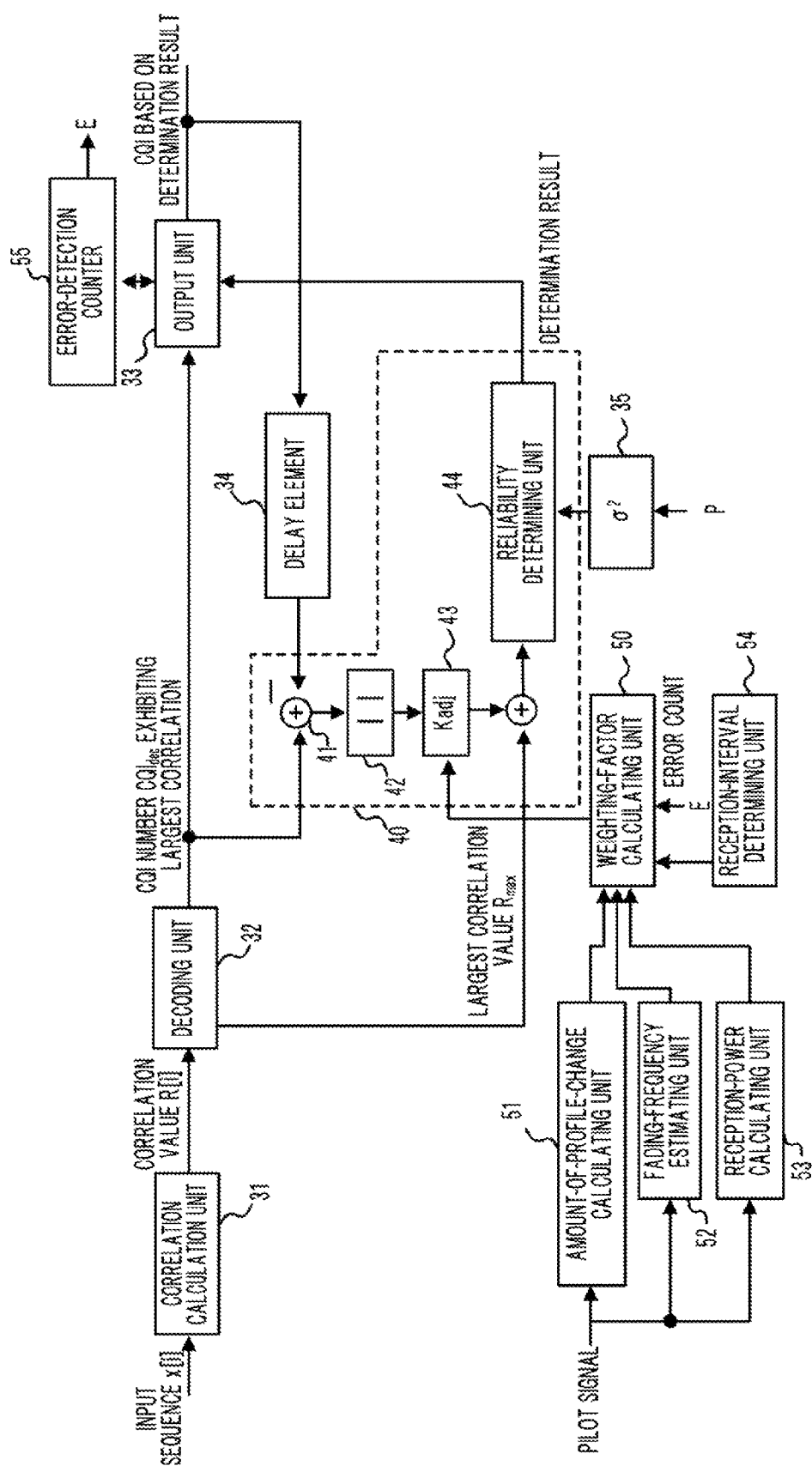
FIG. 6 illustrates one example of a decoding device according to a second embodiment.

FIG. 6 is a diagram illustrating one example of a decoding device according to the second embodiment. The decoding device illustrated in FIG. 6 has a configuration in which the decoding device according to the first embodiment further has a weighting-factor calculating unit 50 for calculating a weighting factor. In addition, the decoding device according to the second embodiment has an amount-of-profile-change calculating unit 51, a fading-frequency estimating unit 52, a reception-power calculating unit 53, a reception-interval determining unit 54, and an error-detection counter 55. Other units are analogous to those described in the first embodiment. A description below is also given of an example in which a CQI value is used as the control data. In order to distinguish among a plurality of pieces of control data, control data corresponding to successfully decoded previous decode data is referred to as "first control data," and control data corresponding to decode data to be decoded and to be subjected to determination as to whether or not decoding next to the previous-decode-data decoding is successful is referred to as "second control data".

The amount-of-profile-change calculating unit 51 uses a pilot signal extracted by the pilot extracting unit 24 to generate a delay profile for the time of transmission of the CQI value. The amount-of-profile-change calculating unit 51 generates a delay profile for the time of transmission of the first control data and stores the generated delay profile in a memory area (not illustrated) included in the amount-of-profile-change calculating unit 51. Next, the amount-of-profile-change calculating unit 51 also generates a delay profile for the time of transmission of the second control data and determines a difference between the delay profile for the time of transmission of the first control data and the delay profile for the time of transmission of the second control data.

For example, the amount of change ΔP in the delay profile may be given by:
ti $\Delta P = \int (P_1(\tau) - P_2(\tau)) d\tau$ where τ denotes delay time, $P_1(\tau)$ denotes a delay profile for the time of reception of the first control data, and $P_2(\tau)$ denotes a delay profile for the time of reception of the second control data.

Figure 7:
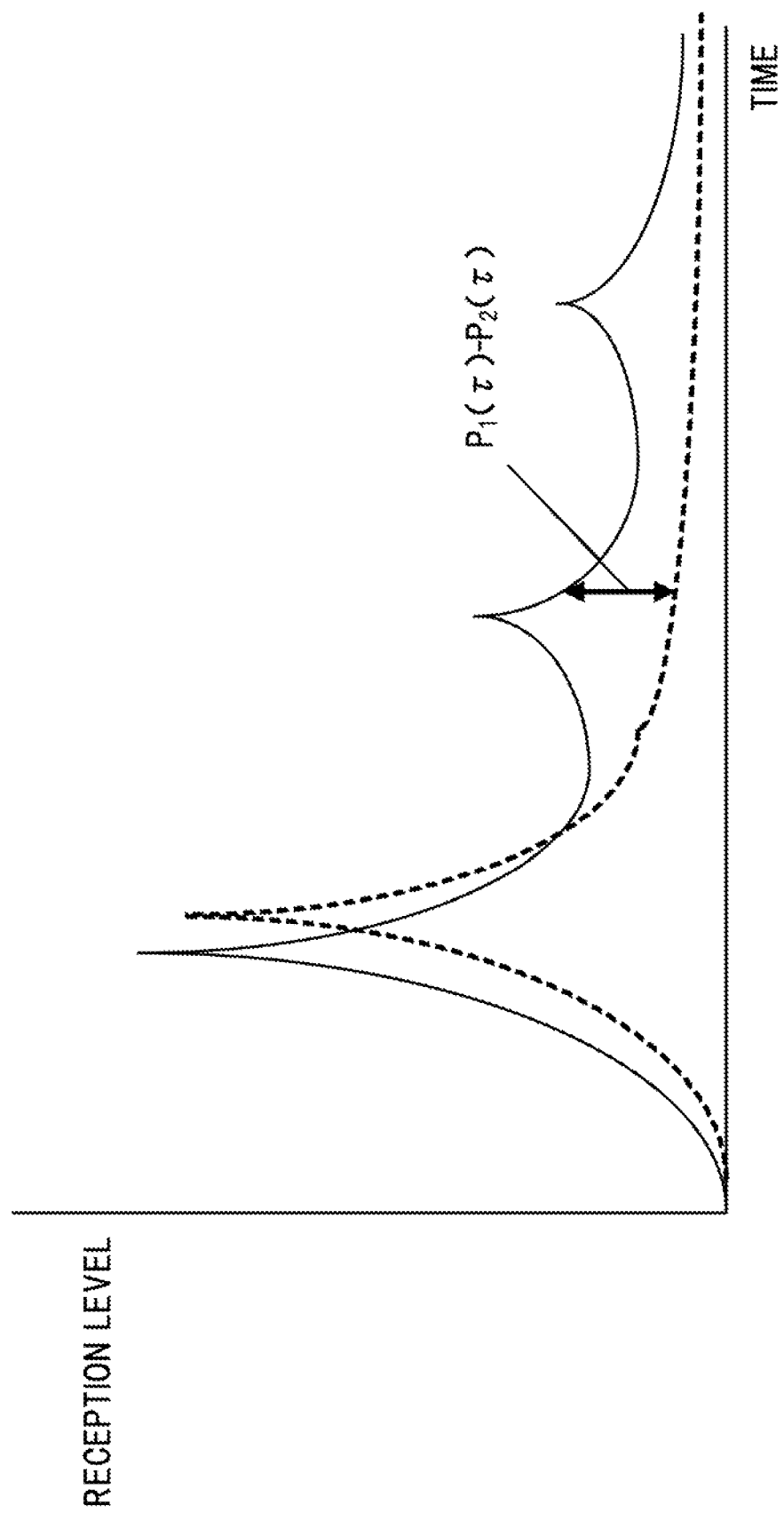
FIG. 7 is a graph depicting a difference between a delay profile for the time of reception of first control data and a delay profile for the time of reception of second control data.

FIG. 7 is a graph depicting a difference between the delay profile for the time of reception of the first control data and the delay profile for the time reception of the second control data. In FIG. 7, the delay profile for the time of reception of the first control data is represented by a solid line and the delay profile for the time of reception of the second control data is represented by a dotted line. $P_1(\tau) - P_2(\tau)$ corresponds to a portion indicated by an arrow in FIG. 7. Since the delay profiles are discretely obtained in practice, the sum of $P_1(\tau) - P_2(\tau)$ is determined as an integration value. The amount-of-profile-change calculating unit 51 outputs the determined amount of change ΔP to the weighting-factor calculating unit 50. Processing performed by the weighting-factor calculating unit 50 is described below.

When it is determined that the decoding of the decode data to be decoded is successful, the amount-of-profile-change calculating unit 51 replaces the data stored in the memory area with the delay profile for the time of transmission of the second control data. The reliability determining unit 44 may report, to the amount-of-profile-change calculating unit 51, whether or not the decoding of the second decode data is successful. The reliability determining unit 44 may also report, to the amount-of-profile-change calculating unit 51 via the weighting-factor calculating unit 50, whether or not the decoding of the second decode data is successful.

The fading-frequency estimating unit 52 uses the pilot signal, input from the pilot extracting unit 24, to estimate a fading frequency for the time of transmission of the CQI value. The reception-power calculating unit 53 uses the pilot signal to calculate reception power of the base transceiver station 20. The fading-frequency estimating unit 52 stores the estimated value with respect to the first control data and the reception-power calculating unit 53 stores the calculated value with respect to the first control data. Upon input of the pilot signal, the fading-frequency estimating unit 52 and the reception-power calculating unit 53 output, to the weighting-factor calculating unit 50, the difference between the value resulting from the input pilot signal and the values stored in the memory area. Upon receiving the report indicating that the decoding of the decode data to be decoded is successful from the reliability determining unit 44 or the weighting-factor calculating unit 50, the fading-frequency estimating unit 52 and the reception-power calculating unit 53 store, in the memory area, the reception power value for the time of reception of the second control data.

The reception-interval determining unit 54 measures intervals at which the CQI values are reported from the mobile station 10 and reports a result of the measurement to the weighting-factor calculating unit 50.

The error-detection counter 55 monitors the determination results sent from the reliability determining unit 44 to the output unit 33 and counts the number of failures in decoding. In response to a request sent from the weighting-factor calculating unit 50, the error-detection counter 55 reports the error detection count to the weighting-factor calculating unit 50.

The weighting-factor calculating unit 50 calculates a weighting factor by using the information reported from the amount-of-profile-change calculating unit 51, the fading-frequency estimating unit 52, the reception-power calculating unit 53, the reception-interval determining unit 54, and the error-detection counter 55. The weighting factor may be calculated using one or more pieces of the information reported from the amount-of-profile-change calculating unit 51 and so on. The weighting-factor calculating unit 50 may also determine a weighting factor by referring to a table in which weighting factors and the numeric values reported from the amount-of-profile-change calculating unit 51 and so on are previously associated with each other. In this case, the weighting-factor calculating unit 50 may hold the table. The arrangement may also be such that the table is stored in a memory (not illustrated) and the weighting-factor calculating unit 50 refers thereto. A description will be given of a case in which, for example, the weighting-factor calculating unit 50 selects a weighting factor by using a table in which the values of weighting factors and intervals at which the CQI values are reported from the mobile station 10 to the base transceiver station 20 are associated with each other.

FIG. 8 illustrates an example of a table in which the values of weighting factors and intervals at which the CQI values are reported from the mobile station 10 to the base transceiver station 20 are associated with each other. In this example, the table is set so that the weighting factor decreases as the intervals at which the CQI values are reported from the mobile station 10 increase. The weighting factors and the CQI reporting intervals may have values determined based on simulation results or actually measured values.

Figure 9:
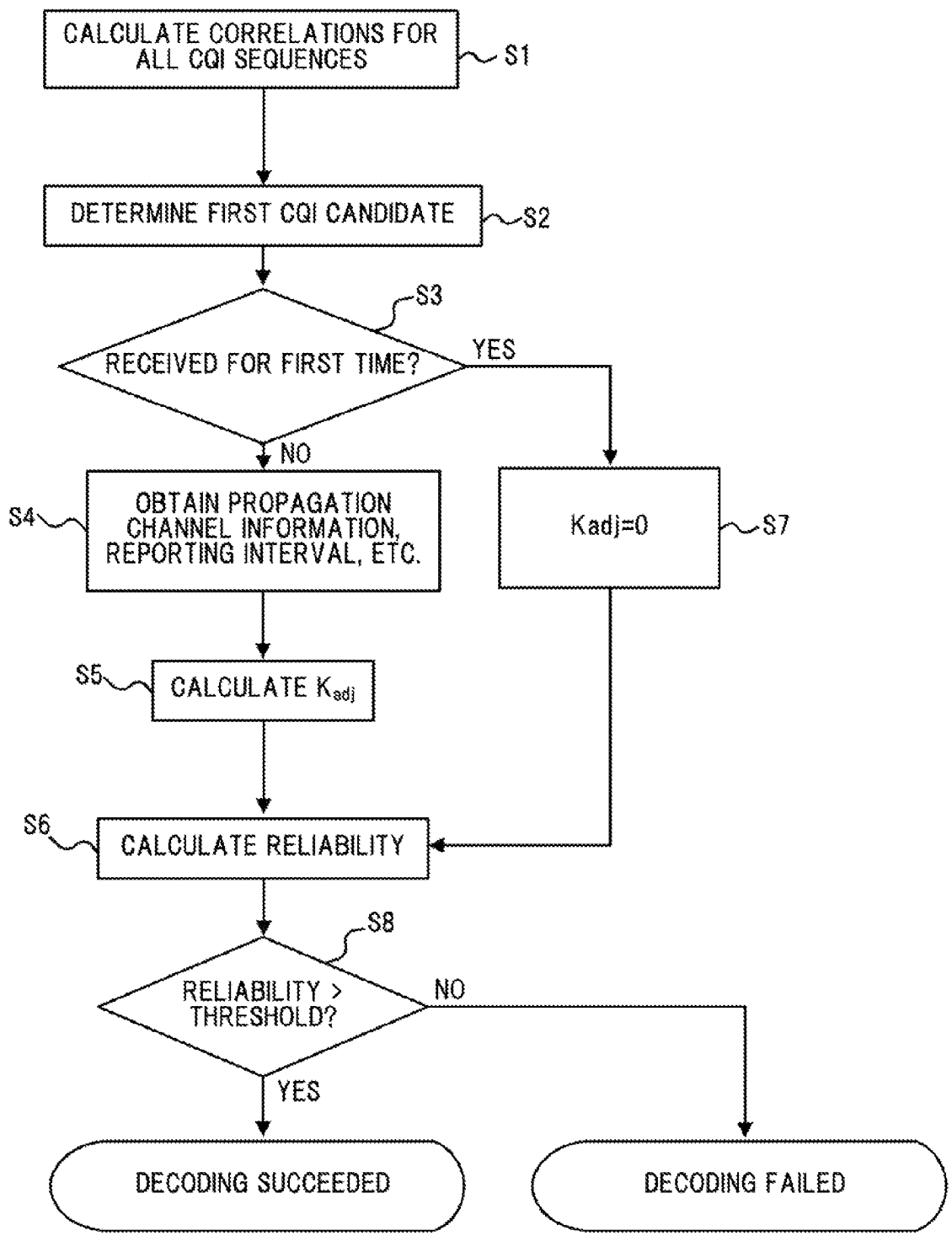
FIG. 9 is a flowchart illustrating one example of the operation performed by the decoding device according to the second embodiment.

FIG. 9 is a flowchart illustrating one example of the operation performed by the decoding device according to the second embodiment. When a symbol sequence is input to the correlation calculation unit 31, in step S1, the correlation calculation unit 31 calculates correlations between the input symbol sequence and all candidate sequences. In step S2, the decoding unit 32 uses the result of the correlation calculation to determine a candidate sequence exhibiting the largest correlation value, and outputs the candidate sequence as decode data. In step S3, the reliability calculating unit 40 checks whether or not the base transceiver station 20 has received the CQI value for the first time. In this case, the reliability calculating unit 40 may also check whether or not decode data is stored in the delay element 34. When no decode data is stored in the delay element 34 for the reason that, for example, the base transceiver station 20 receives control data for the first time, the weighting-factor multiplying unit 43 sets the weighting factor to "0" in step S7 and calculates a reliability indicator in step S6. On the other hand, when it is determined in step S3 that decode data is stored, the reliability calculating unit 40 notifies the weighting-factor calculating unit 50 that decode data is stored and the weighting-factor calculating unit 50 obtains propagation-channel information, a CQI reporting interval, and so on from the reception-interval determining unit 54 in step S4. In step S5, based on the obtained propagation-channel information, CQI reporting interval, and so on, the weighting-factor calculating unit 50 selects a weighting factor by referring to the table illustrated in FIG. 8. The selected weighting factor is output to the weighting-factor multiplying unit 43. In step S6, a reliability indicator is calculated using the weighting factor. In step S8, the reliability indicator is compared with the threshold Th.

For example, the CQI value stored in the delay element 34 as successfully decoded previous decode data is assumed to be 17 ($CQI_{prev}$). It is also assumed that the $R_{max}/\sigma2$ of the decode data to be decoded is 5.9, the decode data to be decoded is 18, the initial setting value of the weighting factor is 1, the threshold Th is 5, and the CQI reporting interval is 20 ms. In this case, in step S4, the weighting-factor calculating unit 50 obtains the CQI reception interval of 20 ms from the reception-interval determining unit 54 and refers to the table in FIG. 8 to reset the weighting factor to 0.8. As a result, the reliability indicator is determined by:

$$C = \frac{R_{max}}{\sigma^2} - K_{adj}|CQI_{dec} - CQI_{prev}| = 5.9 - 0.8 \times |(18-17)| = 5.1$$

Comparison between the reliability indicator C and the threshold Th indicates 5.1>5, that is, C>Th. Thus, it is determined that the decoding is successful. In this case, when the reliability indicator is calculated without a change in the weighting factor, the reliability indicator C is determined as:

$$C = \frac{R_{max}}{\sigma^2} - K_{adj}|CQI_{dec} - CQI_{prev}| = 5.9 - 1.0 \times |(18-17)| = 4.9$$

Because of 4.9<5, it is determined that C<Th and it is thus determined that the decoding failed.

Since the weighting-factor calculating unit 50 changes the setting of the weighting factor in the manner described above, it is possible to reduce or prevent erroneous determination due to setting of an inappropriate weighting factor. When the interval of transmitting the control data is large, the state of the radio propagation channel is more likely to change from when control data is transmitted until next control data is transmitted. Thus, the table in FIG. 8 is set so that the weighting factor decreases as the CQI-value reporting interval increases.

Figure 10:
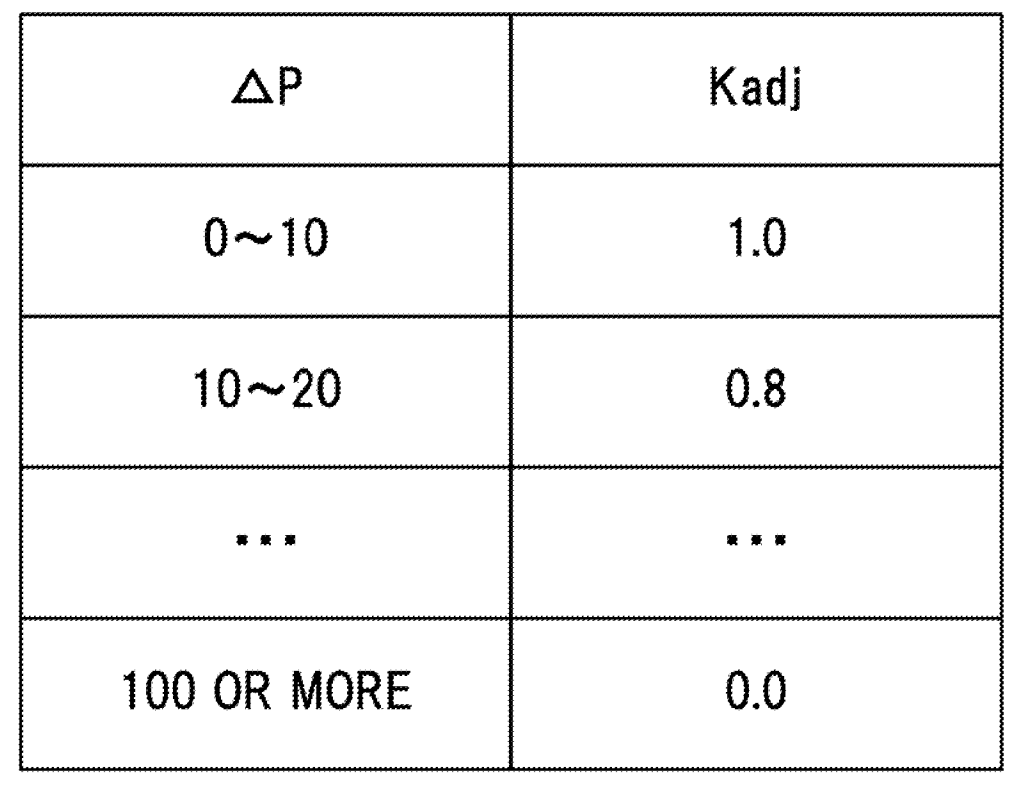

Although a case in which the weighting factor is changed using the CQI-value reporting interval has been described above with reference to FIGS. 8 and 9, the weighting-factor calculating unit 50 may also change the weighting factor by using the information obtained from the amount-of-profile-change calculating unit 51 and the fading-frequency estimating unit 52, as described above. In this case, in step S4, the weighting-factor calculating unit 50 obtains the information from the amount-of-profile-change calculating unit 51 and so on to determine the weighting factor. The weighting-factor calculating unit 50 may also refer to, for example, a table (as illustrated in FIG. 10) in which relationships between the amounts of change in delay profiles and weighting factors are set. Depending on information used, the weighting-factor calculating unit 50 may also use a table (as illustrated in FIG. 11) indicating relationships between the amounts of change in the fading frequencies and weighting factors or a table (as illustrated in FIG. 12) indicating relationships between changes in the reception power and weighting factors. All of the tables in FIGS. 8 and 10 to 12 are set so that the weighting factor decreases as the amount of change reported to the weighting-factor calculating unit 50 increases. This is because it is presumed that a change in the CQI value is large when a change in the state of the propagation channel is large. Changing the weighting factor based on the amount of change in the radio propagation channel makes it possible to prevent correctly decoded decode data from being erroneously determined as being decoded unsuccessfully. One possible reason for a change in the state of the radio propagation channel is movement of the mobile station 10.

FIG. 13 illustrates one example of a table indicating relationships between continuous error counts and weighting factors. When the number of failures in decoding of the received control data is large, it is highly likely that the state of the propagation channel changed from when a signal corresponding to the CQI value stored in the delay element 34 is received until a signal corresponding to the decode data to be decoded is received. Thus, in the example in FIG. 13, the weighting factor is set so that the weighting factor decreases as the number of continuous failures increases.

The weighting-factor calculating unit 50 may also determine the weighting factor by using a plurality of pieces of information sent from the amount-of-profile-change calculating unit 51 and so on. In such a case, the weighting-factor calculating unit 50 may also determine the weighting factor by using a specified method. For example, the weighting-factor calculating unit 50 may individually calculate a coefficient Kfad obtained from a difference in the fading frequency, a coefficient Kfail obtained from evaluation of the continuous error count, and a coefficient Krep obtained from the CQI reporting interval and then use the product of the calculated coefficients as the weighting factor. That is, in this case, a value given by Kfail×Kfad×Krep is set as the weighting factor.

A table (as illustrated in FIG. 14) in which a plurality of pieces of information obtained by the weighting-factor calculating unit 50 and weighting factors are associated with each other may be prepared so as to allow the weighting-factor calculating unit 50 to select a weighting factor there-from. Setting a weighting factor by using a plurality of indicators indicating a change in the state of the propagation channel, as described above, makes it possible to perform decoding-error detection corresponding to the amount of change in the propagation channel.

<Third Embodiment>

Figure 15:
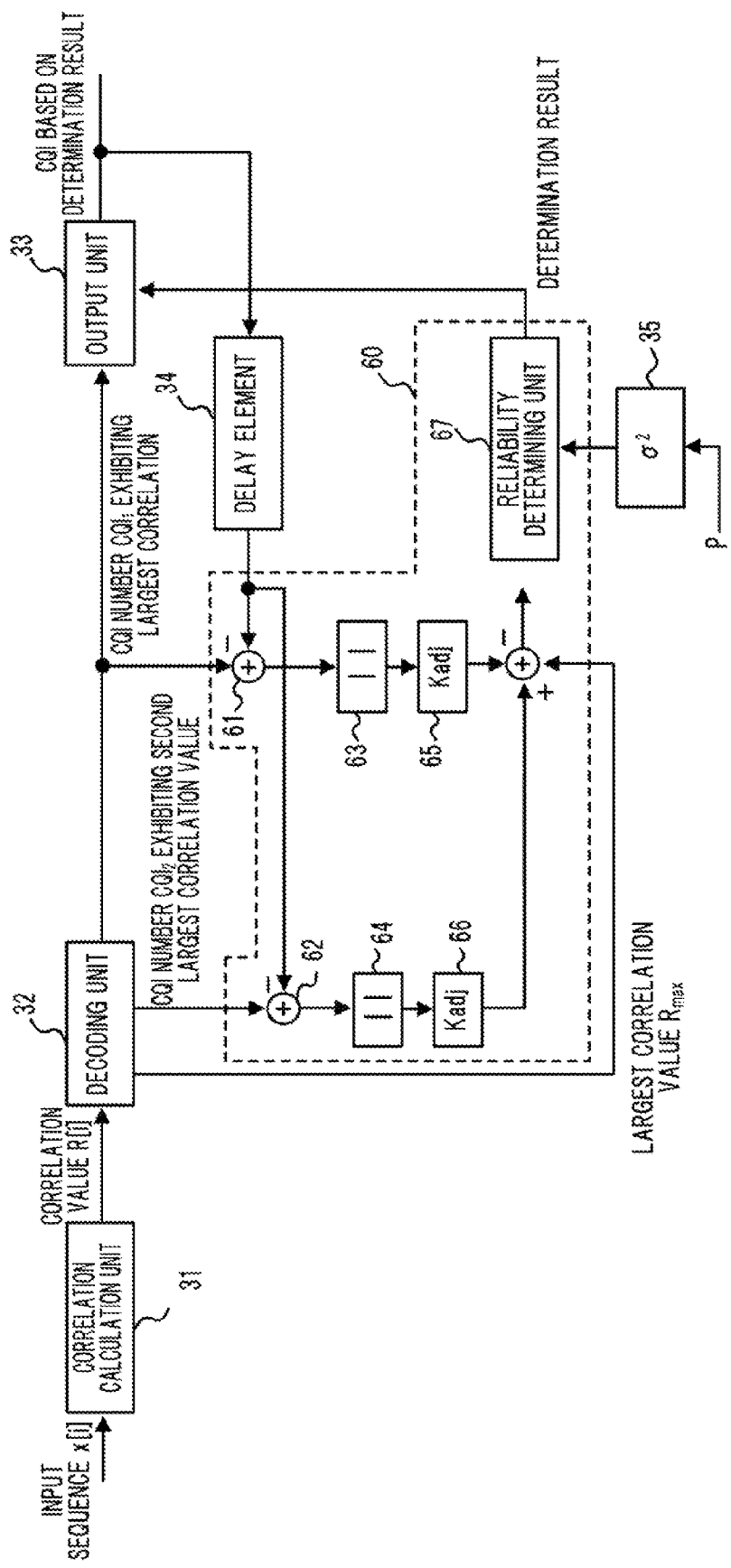
FIG. 15 illustrates one example of a decoding device according to a third embodiment.

FIG. 15 is a diagram illustrating one example of a decoding device according to a third embodiment. The decoding device illustrated in FIG. 15 uses both a candidate sequence exhibiting the largest correlation with decode data to be decoded and a candidate sequence exhibiting the second largest correlation to determine a reliability indicator of the decode data to be decoded.

The decoding unit 32 uses the candidate sequences and correlation values, input from the correlation calculation unit 31, to select, as decode data to be decoded, a CQI value indicated by the candidate sequence exhibiting the largest correlation value. The decoding unit 32 outputs the selected CQI value to the output unit 33 and a reliability calculating unit 60. The decoding unit 32 also outputs, to the reliability calculating unit 60, a CQI value indicated by the candidate sequence exhibiting the second largest correlation value. At this point, the decoding unit 32 also outputs the largest correlation value and the second largest correlation value to the reliability calculating unit 60.

The reliability calculating unit 60 includes adders 61 and 62, absolute-value determining units 63 and 64, weighting-factor multiplying units 65 and 66, and a reliability determining unit 67. The adder 61, the absolute-value determining unit 63, and the weighting-factor multiplying unit 65 determine a value obtained by multiplying a similarity between decode data $CQI_{dec}$ to be decoded and previous decode data $CQI_{prev}$ by a weighting factor. The adder 62, the absolute-value determining unit 64, and the weighting-factor multiplying unit 66 determine a value obtained by multiplying a similarity between a CQI value $CQI_{dec2}$ indicated by the candidate sequence exhibiting the second largest correlation value and the previous decode data $CQI_{prev}$ by a weighting factor. By using the noise level and the similarities multiplied by the weighting factors and output from the weighting-factor multiplying unit 65 and the weighting-factor multiplying unit 66, the reliability determining unit 67 calculates a reliability indicator in accordance with:

$$C = \frac{R_{max}}{\sigma^2} - K_{adj1}|CQI_{dec} - CQI_{prev}| + K_{adj2}|CQI_{dec2} - CQI_{prev}| \quad (3)$$

In equation (3), a term for $CQI_{dec2}$ is added to equation (1) noted above. When the reliability of the decode data to be decoded is high, the possibility that the value of the candidate sequence whose correlation value is the second largest or subsequent correlation values are decoding results becomes low. Since the CQI value does not change greatly when the state of the radio propagation channel does not change, a CQI value having a large similarity with the successfully decoded decode data prior to the decode data to be decoded is reliable as a decoding result. Accordingly, when the decoding is successful, it may be regarded that the similarity between the decode data to be decoded and the previous decode data is large and the similarity between $CQI_{dec2}$ and the previous decode data is small. When the similarity between the decode data to be decoded and the previous decode data is large in equation (3), the value of the second term becomes small and the value of the reliability indicator becomes large. When the similarity between $CQI_{dec2}$ and the previous decode data is small, the value of the third term becomes large and the value of the reliability indicator becomes large.

The correlation calculation unit 31, the output unit 33, the delay element 34, and the noise determining unit 35 operate as described above. The decoding device illustrated in FIG. 15 is merely one example and changes may thus be made thereto. For example, the reliability calculating unit 60 may also be used in a decoding device having a weighting-factor changing capability as in the second embodiment.

<Modifications>

The present invention is not limited to the above-described embodiments, and various modifications may be made thereto. Some examples will be described below.

The decoding device in any of the above-described embodiments may also decode other control data indicating the state of the radio propagation channel, except for the CQI values. For example, the disclosure herein is applicable to, in precoding multiple-input multiple-output (MIMO), decoding a precoding matrix indicator (PMI) number used for reporting a precoding matrix to be used. Since the PMI number also does not change unless the state of the radio propagation changes, comparison with the previous decode data makes it possible to improve the decoding-error detection accuracy. In this case, the PMI number is a number indicating which precoding matrix is to be used, not a quantity directly indicating a size, unlike the CQI. Accordingly, when the disclosure herein is applied to decoding the PMI number, a pre-defined function $f(PMI_{dec}, PMI_{prev})$ is used to determine the similarity, rather than determining the difference between previous decode data $PMI_{prev}$ and decode data $PMI_{dec}$ to be decoded. The reliability calculating unit 40 or the reliability calculating unit 60 may be modified according to a function for calculation, so as to allow for calculation of the value of $f(PMI_{dec}, PMI_{prev})$. Through the use of a table (as illustrated in FIG. 16) in which changes in the PMI number and the pre-calculated sizes of contribution (inter-PMI distances) that the changes in the PMI number make to the reliability indicator of the decode data are associated with each other, the reliability calculating unit 40 and the reliability calculating unit 60 may also calculate the reliability indicator. In such a case, the table indicating the changes in the PMI and the inter-PMI distances may also be stored in the reliability calculating unit 40 or the like. The reliability calculating unit 40 or the like may also read, from a memory, the table indicating the changes in the PMI and the inter-PMI distances.

Although a case in which two units, e.g., the correlation calculation unit 31 and the decoding unit 32, perform decoding has been described above, a unit or units that perform decoding may be changed depending on the implementation. For example, the correlation calculation unit 31 and the decoding unit 32 may be integrated into a single decoding unit. A modification may also be made so that the correlation calculation unit 31 calculates the correlation values and selects a candidate sequence (e.g., a 20-bit candidate sequence) exhibiting the largest correlation value and reports, as a decoding result, the largest correlation value and the candidate sequence exhibiting the largest correlation value to the decoding unit 32. In such a case, the decoding unit 32 converts the reported candidate sequence into a CQI value and outputs the reported largest correlation value to the reliability calculating unit 40.

The decoding device according to any of the first to third embodiments may also perform calculation with the weighting factor used for reliability indicator determination being zero, when successfully decoded decode data is not stored in the delay element 34.

Some or all of the units included in the decoding devices illustrated in the first to third embodiments may be realized by software or may be realized by hardware circuitry. The reliability calculating unit 40 and the reliability calculating unit 60 may also be partially modified depending on the implementation. For example, the correlation values, the similarity or similarities multiplied by the weighting factor(s), and the amplitudes of noise may be directly input to the reliability determining unit 44 or 67 or may be input to the reliability determining unit 44 or the like via another unit.

Additionally, in any of the embodiments described above, a modification may also be made so that another calculation using the similarity between the previous decode data and the decode data to be decoded is performed to determine the reliability indicator. For example, a modification may be made so that the largest correlation value, the noise level, and the second largest correlation value $R_{max2}$, in addition to the similarity, are used to calculate the reliability in accordance with:

$$C = \frac{R_{max} - R_{max2}}{\sigma^2} - K_{adj}|CQI_{dec} - CQI_{prev}|.$$

According to the above-described embodiments, the decoding-error detection accuracy in a radio communications system is improved.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A decoding device comprising:
a processor, and
a memory storing instructions that, when executed by the processor, cause the decoding device to
decode control data to generate decode data, the control data indicating a state of a radio propagation channel;
calculate a reliability indicator indicating a reliability of the decode data; and
output decode data whose reliability indicator is larger than a specified threshold;
wherein the reliability indicator is based on a similarity between the decode data and a previous decode data which has been generated by decoding a previous control data indicating a previous state of the radio propagation channel which is measured before the state of the radio propagation channel, and the reliability indicator of the previous decode data is larger than the specified threshold.

2. The decoding device according to claim 1, wherein the processor calculates the reliability indicator based on the similarity indicator multiplied by a weighting factor, and the weighting factor indicates a size of contribution that the similarity indicator makes to a decoding reliability of the decode data.

3. The decoding device according to claim 2, wherein the processor calculates correlation values between the control data and a plurality of candidate sequences and outputs, as the decode data, a candidate sequence exhibiting a largest correlation value, and calculates the reliability indicator in accordance with:

$$C = \frac{R_{max}}{\sigma^2} - K_{adj}|CQI_{dec} - CQI_{prev}|$$

where $R_{max}$ denotes the largest correlation value, $\sigma^2$ denotes a noise level when the control data is received, $K_{adj}$ denotes the weighting factor, $CQI_{dec}$ denotes the decode data, $CQI_{prev}$ denotes the previous decode data, and C denotes the reliability indicator.

4. The decoding device according to claim 3, wherein the processor calculates the reliability indicator with the weighting factor being zero, when no decode data is previously stored.

5. The decoding device according to claim 2, further comprising:
a counter that counts a number of times that decoding failures of the decode data is determined; and
wherein the processor calculates the weighting factor so that the weighting factor decreases as the number counted by the counter increases.

6. The decoding device according to claim 2, wherein the processor determines a receiving interval for receiving the control data;
and calculates the weighting factor so that the weighting factor decreases as the receiving interval increases.

7. The decoding device according to claim 2, wherein the processor calculates the weighting factor so that the weighting factor decreases as a difference between a first state of a propagation channel used for communication of the control data corresponding to the previous decode data and a second state of a propagation channel used for communication of the control data corresponding to the decode data increases.

8. The decoding device according to claim 7, wherein the processor determines the difference between the first and second states of the propagation channels by using at least one of a fading frequency change, a reception power change, and a delay profile change that occur between when control data corresponding to the previous decode data is communicated and when control data corresponding to the decode data is communicated.

9. The decoding device according to claim 1, wherein the processor calculates correlation values between the control data and a plurality of candidate sequences and outputs a candidate sequence exhibiting the largest correlation value and a candidate sequence exhibiting the second largest correlation value, and calculates the reliability indicator of the decode data, based on a first similarity indicator indicating a similarity between the decode data and the previous decode data and a second similarity indicator indicating a similarity between control data indicated by the candidate sequence exhibiting the second largest correlation value and the previous decode data.

10. The decoding device according to claim 9, wherein the processor calculates the reliability indicator so that the reliability indicator increases as the first similarity indicator increases, and the reliability indicator decreases as the second similarity indicator increases, based on the first similarity indicator multiplied by a first weighting factor and the second similarity indicator multiplied by a second weighting factor.

11. The decoding device according to claim 10, wherein the processor calculates the reliability indicator in accordance with:

$$C = \frac{R_{max}}{\sigma^2} - K_{adj1}|CQI_{dec} - CQI_{prev}| + K_{adj2}|CQI_{dec2} - CQI_{prev}|$$

where $R_{max}$ denotes the largest correlation value, $\sigma^2$ denotes a noise level when the control data is received, $K_{adj1}$ denotes the first weighting factor, $K_{adj2}$ denotes the second weighting factor, $CQI_{dec}$ denotes the decode data, $CQI_{dec2}$ denotes the control data indicated by the candidate value exhibiting the second largest correlation value, $CQI_{prev}$ denotes the previous decode data, and C denotes the reliability indicator.

12. A decoding-error detection method comprising:

decoding control data indicating a radio propagation channel state into decode data;

calculating a reliability indicator of decode data, based on a similarity between the decode data and previous decode data which has been generated by decoding a previous control data indicating a previous state of the radio propagation channel which is measured before the state of the radio propagation channel, and the reliability indicator of the previous decode data is larger than a threshold, the reliability indicator indicating a decode-data reliability; and determining that the decoding of the decode data is successful when the reliability indicator of the decode data exceeds the threshold.

13. The decoding-error detection method according to claim 12, wherein when the decoding of the decode data to be decoded is successful, a reliability indicator of new decode data decoded next to the decode data is calculated using a similarity between the decode data and the new decode data;

when the decoding of the decode data to be decoded is unsuccessful, the reliability indicator of the new decode data is calculated using a similarity between the previous decode data and the new decode data; and the reliability indicator of the new decode data is compared with the threshold to determine if the decoding of the new decode data is successful.

14. The decoding-error detection method according to claim 12, wherein correlation values between the control data and a plurality of candidate values are calculated;

a first similarity indicator indicating a similarity between the decode data and the previous decode data is calculated, a candidate sequence exhibiting the largest correlation value being the decode data;

a second similarity indicator indicating a similarity between the control Data indicated by a candidate sequence exhibiting the second largest correlation value and the previous decode data is calculated; and the reliability indicator of the decode data is calculated based on the first similarity indicator and the second similarity indicator.

* * * * *